United States Patent [19]
Van Der Laan et al.

[11] Patent Number: 6,028,660
[45] Date of Patent: Feb. 22, 2000

[54] ILLUMINATION UNIT FOR AN OPTICAL APPARATUS

[75] Inventors: Hans Van Der Laan, Veldhoven; Johannes C. H. Mulkens, Eindhoven; Judocus M. D. Stoeldrayer, Hapert, all of Netherlands

[73] Assignee: ASM Lithography B.V., Netherlands

[21] Appl. No.: 08/684,873

[22] Filed: Jul. 25, 1996

[30] Foreign Application Priority Data

Feb. 23, 1996 [EP] European Pat. Off. .............. 96200468

[51] Int. Cl.⁷ .......................... G03B 27/42; G03B 27/54; G02B 26/08
[52] U.S. Cl. .............................. 355/67; 355/53; 359/209; 359/211
[58] Field of Search ................... 355/67, 53, 77, 355/43, 45; 353/31; 359/39, 42, 40, 209, 211; 430/311; 250/548

[56] References Cited

U.S. PATENT DOCUMENTS

| | | | |
|---|---|---|---|
| 5,309,198 | 5/1994 | Nakagawa | 355/67 |
| 5,343,270 | 8/1994 | Sakakibara et al. | 355/53 |
| 5,798,824 | 8/1998 | Kudo | 355/67 |

FOREIGN PATENT DOCUMENTS 2244553A  12/1991  United Kingdom .

OTHER PUBLICATIONS

"Optics Guide 3", Melles Griot, Irvine, CA. 1985, pp. 238–239. no date (month).

*Primary Examiner*—David M. Gray
*Assistant Examiner*—Peter B. Kim
*Attorney, Agent, or Firm*—Pillsbury Madison & Sutro, LLP

[57] ABSTRACT

Illumination unit (2) for an optical system, including an illumination system (1) which comprises, in this order, a radiation source (3) and a first optical integrator (11). The illumination unit (2) further comprises a detection system (45) including a radiation-sensitive detector (47). The illumination system (1) comprises a second optical integrator (13). The two integrators (11, 13) enclose a prism system (15) comprising at least one prism (17). The prism system (15) has a coupling-out surface via which light can be coupled out of the illumination system (1), and an exit surface via which light can be coupled out of the prism system (15), without the intensity in the main light path being essentially influenced. The detection system (45) is arranged proximate to the exit surface of the prism system (15) and comprises light-integrating means.

27 Claims, 10 Drawing Sheets

ILLUMINATION UNIT FOR AN OPTICAL APPARATUS

BACKGROUND OF THE INVENTION

1. Field of the Invention

The invention relates to an illumination unit for an optical system, including an illumination system which comprises, in this order, a radiation source unit, a first optical integrator, and a detection system including a radiation-sensitive detector for measuring an illumination dose.

The invention also relates to an optical apparatus for step and/or scan-imaging a mask pattern on a substrate, which apparatus is provided with such an illumination unit.

2. Description of the Prior Art

An illumination unit of the type described in the opening paragraph is known, for example, from U.S. Pat. No. 5,343,270. Such an illumination unit may be used, for example, in a wafer stepper. A wafer stepper is an optical apparatus for optically and repetitively imaging a mask pattern in a photosensitive layer which is present on a substrate, for example, a silicon substrate and which is used for manufacturing integrated circuits (ICs). A projection lens system images the pattern on a first sub-area, or field, of the substrate. Wafer steppers can be distinguished into steppers and scanners. In a stepper, the mask pattern is imaged on a field in one run. Subsequently, the substrate is moved along an accurately defined distance, whereafter the pattern is imaged on a subsequent substrate field, after which the substrate is moved again. This operation is repeated until the mask pattern has been imaged on the desired substrate fields. In optical lithography, one of the objects is to image smaller details, so that more components can be accommodated on an IC. For this purpose, a projection lens having a larger numerical aperture (NA) must be used, which has, however, a smaller depth of focus. Another object is to illuminate larger fields, so that the number of components per IC can also be raised in that way. For this purpose, the projection lens must have a larger image field. The requirements of a larger NA and a larger image field contradict each other which, in practice, can only be fulfilled to a certain extent with a great deal of trouble and at a high cost, and are altogether impossible in the case of even further enlargements. It has therefore been proposed to image the mask pattern in a scanning mode. In this mode, a part of the mask pattern is imaged each time on a corresponding part of a substrate field. To this end, only a part of the mask pattern is illuminated, and the mask and the substrate are moved synchronously with respect to the projection lens and the illumination beam until the entire mask pattern has been imaged on the substrate field. When a full field has been illuminated, for example, the substrate is moved along an accurately defined distance, similarly as in a stepper, so that the next field is reached.

In order to form well-defined patterns in the substrate, this substrate should be illuminated with an accurately determined quantity of energy, hereinafter referred to as dose. Moreover, the illumination of a substrate field should be performed as rapidly as possible, so that a maximal number of substrates can be illuminated per unit of time. It is therefore of great importance that the actual dose is measured in an accurate and reliable manner, so that it can be rendered equal to the desired dose as accurately as possible.

To measure the dose, a radiation-sensitive detector is arranged in the radiation path of the illumination beam, behind a partly transmissive folding mirror in the illumination system described in U.S. Pat. No. 5,343,270. The detection unit described in U.S. Pat. No. 5,343,270 does not allow for the fact that, dependent on the mode of operation, one wants to have the facility of changing the energy distribution within the illumination beam in the current step and/or scanning photolithographic apparatuses.

Since the active surface area of the detector with which the measurement takes place is generally relatively small, the distribution of light at the area of this surface should be very homogeneous, and a maximal quantity of radiation should reach the detector.

SUMMARY OF THE INVENTION

It is an object of the invention to provide an illumination unit with which the illumination dose can be measured very accurately and stable with time, while using different illumination modi, the illumination beam at the location of the detector of the detection system being relatively homogeneous.

To this end, the illumination unit according to the invention is characterized in that the illumination system comprises a second optical integrator, and in that the two integrators enclose a prism system comprising at least one prism, which prism system has a coupling-out surface via which a fraction of light can be coupled out of the illumination system, and an exit surface via which said fraction of light can be coupled out of the prism system, the entrance aperture of the detection system being situated proximate to the exit surface of the prism system.

In the first place, the second integrator restores the uniformity of the light beam transmitted by the coupling-out surface and may enhance the uniformity realized by the first integrator.

The integrators may be, for example, optically transparent bars made of, for example, quartz.

A construction of integrators enclosing a prism system is relatively simple and allows the provision of an energy sensor at a position where the illumination dose can be measured in a reliable and reproducible manner.

A preferred embodiment of the illumination unit according to the invention is characterized in that the detection system comprises light-integrating means.

In this way, further integration within the detection system is ensured, so that the extent of integration at the area of the radiation-sensitive detector is much higher than in, for example, the illumination unit of said United States patent.

If the illumination unit is provided with an internal REMA, the illumination unit has the advantage that, viewed from the light source, the detection system precedes the internal REMA. It is therefore sufficient to use a detector having a relatively small dynamic range.

A first embodiment of the illumination unit according to the invention is characterized in that the prism system comprises one prism whose hypotenuse is the coupling-out surface of the illumination system and the exit surface of the prism system.

In a very simple embodiment of the illumination unit, the prism system comprises a single prism. The coupling-out surface and the exit surface coincide and are constituted by the hypotenuse of this prism. The extent of transmission in the direction of the detection system is determined by the design of the hypotenuse. The factor of transmission towards the detection system is preferably so small that the intensity of the illumination beam from the radiation source is not influenced essentially.

A further drawback of the known illumination unit is that illumination beam radiation which is reflected by components situated in the radiation path behind the dose detection unit may reach the radiation-sensitive detector of this unit. Consequently, the dose measurement may also be unreliable. Such back-reflections may originate from the mask, the substrate, optical components between the prism system and the substrate, and from the internal REMA (reticle masking system), if present, with which the illuminated field on the mask is sharply bounded.

A second embodiment of the illumination unit according to the invention is therefore characterized in that the prism system comprises a first and a second prism whose hypotenuses face each other, while the coupling-out surface is located between the two prisms and the exit surface coincides with the top surface of the second prism.

The greater part of the light beam leaving the first integrator and entering the first prism is transmitted at the hypotenuse of the first prism towards the second integrator, while a small fraction will go to the second prism. This light will leave the second prism via the top surface after possible total internal reflection on the side surface. Light which reaches the second prism after back-reflections will leave the second prism via the side surface. In this manner, the second prism thus ensures that the light from the radiation source and the light which is due to back-reflections are separated from each other. The light generated by back-reflections will consequently have no influence or hardly any influence on the measurement by the detector. The light to be measured, coming from the radiation source, is concentrated on the top surface of the second prism.

Another embodiment of the illumination unit according to the invention, in which the prism system comprises two prisms, is characterized in that the prism system comprises a first and a second prism whose hypotenuses face each other, while the coupling-out surface is located between the two prisms and the exit surface coincides with the side surface of the first and the second prism.

In this case, for example, the two integrators are in alignment, and the measuring beam is split substantially perpendicularly to the main light path.

In the illumination unit according to the invention, it is thus possible to couple an amount of light out of the illumination system, with reference to which the illumination dose incident on the substrate can be measured in a reliable manner.

By adding a second prism, the radiation beam, which is coupled out and with reference to which the illumination dose is measured, is better separated from that of the unwanted radiation which is back-reflected on components in the light path. The risk of unwanted radiation reaching the detector is reduced in this way.

A fourth embodiment of the illumination unit according to the invention is characterized in that the prism system comprises a first and a second prism whose hypotenuses face each other, in which a third prism is present between the first and the second prism, at one end, and the first integrator, at the other end, the hypotenuse of said third prism being provided with a highly reflective layer, while the coupling-out surface is located between the first and the second prism and the exit surface coincides with the top surface of the second prism.

The light from the first integrator is deflected by the third prism. Subsequently, a relatively small fraction of light is reflected on the coupling-out surface towards the detection system, while the greater part of the light beam is passed on to the second integrator.

An advantage of this embodiment is that the deflection function and the coupling-out function are allocated to different hypotenuses. In this manner, it is possible to optimize the function of the layers provided on these hypotenuses.

Moreover, it is not necessary in this embodiment that an air gap is present between the first prism and the second integrator so as to maintain the angular distribution within the light beam. This provides the possibility of integrating the first prism with the integrator, when the integrator is, for example, an optically transparent bar. The entrance surface of this bar at the side of the prism system may then be provided with an oblique side at an angle of, for example, 45°. The hypotenuse of the second prism is then situated opposite this oblique side.

A further embodiment of the illumination unit according to the invention is characterized in that the hypotenuse of the first prism is provided with a reflective layer which is at least partly transmissive.

The layer should reflect within a relatively large angular range. The greater part of the light incident on the reflective layer will go to the second integrator and will not reach the second prism.

What is to be understood by a relatively large angular range will be illustrated with reference to a numerical example. If the angular distribution of the light beam in air is between −40° and +40°, this will be between −25° and +25° in the integrator, in the case of a quartz bar. With respect to the normal on the hypotenuse of the prism, this results in an angular range of between 20° and 70°.

The desired transmission factor may be achieved, for example, by adapting the thickness of the layer.

A further embodiment of the illumination unit according to the invention is characterized in that the hypotenuse of the first prism is provided with a transmissive layer which is at least partly reflective.

Here again, the transmission and reflection coefficients of the layer are determined by the thickness of this layer.

Dependent on the configuration of the prism system and the integrators, the measuring beam is transmitted or reflected at the coupling-out surface.

A further embodiment of the illumination unit according to the invention is characterized in that the layer has a plurality of holes.

This is another possibility of realizing a reflective layer having the required transmission factor, instead of adapting the thickness of the layer. For the light which is incident on the hypotenuse of the first prism at positions where the reflective layer is interrupted, the angle of incidence determines the reflection. For angles which are smaller than the critical angle for total internal reflection, transmission will occur, whereas for angles of incidence which are larger than this critical angle, the light is not coupled out but will be sent to the second integrator.

A further advantage of a layer provided with holes is that, at the location of the holes, thus where transmission may occur, environmental factors do not substantially have any influence, because the side represented by the hypotenuse is not treated at these locations. The reflective layer, which is liable to these factors, can then be rendered optically dense in an optimum manner.

A further embodiment of the illumination unit according to the invention is characterized in that the layer comprises aluminium.

Aluminium is a very suitable material for this use, because the reflection is relatively independent of angles.

A further embodiment of the illumination unit according to the invention is characterized in that the layer comprises a dielectric material.

A relatively high reflection can be achieved by means of a dielectric layer. To realize a relatively high reflection within a relatively large angular range, a stack of sub-layers of different dielectric materials having different refractive indices is required. The number of layers is determined by the desired transmission factor, the desired reflection and the desired angular range.

The dielectric material may be combined or not combined with aluminium. An advantage of such a combination is that the relatively large angular range of aluminium can be combined with a relatively high reflection of the dielectric material.

The dielectric layer may be provided or not provided with holes so as to achieve the desired transmission coefficient.

A further embodiment of the illumination unit according to the invention is characterized in that projections are present on the hypotenuse of one of the two prisms, which projections are in optical contact with the hypotenuse of the other prism.

If the hypotenuse of, for example, the first prism is untreated and if the hypotenuse of, for example, the second prism is provided with projections of a material having the same refractive index as that of the two prisms, light which is incident at the location of the projections will be transmitted, whereas the angle of incidence of light which is incident between the projections will determine whether or not reflection occurs.

If the hypotenuse of the first prism is provided with a dielectric layer and, in combination therewith, the second prism is provided with projections of a material having the same refractive index as that of the two prisms, a part of the light incident on the dielectric layer at the location of a projection will be reflected, notably at the smaller angles of incidence, and another part will be transmitted, notably at the larger angles of incidence, because the total internal reflection is eliminated at the location of the projections. Where there is no projection, reflection is realized by the dielectric layer.

If the dielectric layer is provided with holes, a part of the light incident on the holes in the layer will undergo total internal reflection and another part, notably that with the small angles of incidence, will be transmitted via the hypotenuse to the second prism, dependent on the angle of incidence. The fraction of the incident beam which is coupled out via the coupling-out surface is thus dependent on the angular distribution within the incident light beam.

By using holes in the dielectric layer on the hypotenuse of the first prism as well as projections on the hypotenuse of the second prism, a symmetrical angular transmission is obtained. In this manner, light rays having a small angle of incidence will be transmitted through the holes and light rays which are incident at a larger angle of incidence will be transmitted through the projections. The transmission through the projections and the holes is complementary. The projections may be obtained, for example, by etching away the intermediate material. In this case, the measurement by the detection system will be independent of the angular distribution within the light beam.

A further embodiment of the illumination unit according to the invention is characterized in that material having a larger optical density than that of the projections is present between the projections.

This will as yet obstruct the light which was transmitted by the dielectric layer in an unwanted manner.

A further embodiment of the illumination unit according to the invention is characterized in that the hypotenuse of the first prism has a surface structure in the form of prisms, recesses or a microdiffuser.

A well-defined transmission factor of the coupling-out surface can be achieved by a microstructure, for example, in the form of microprisms, recesses or a microdiffuser, which factor is in principle independent of the angular distribution within the light beam due to the nature of these structures.

A further embodiment of the illumination unit according to the invention is characterized in that the hypotenuses of the first and the second prism are glued together, the refractive index of the glue and the refractive index of the prisms being substantially equal.

By gluing the two prisms together, the total internal reflection is eliminated. Now, the reflection is only dependent on the reflecting effect of the reflective layer. The light which is now incident on the holes is evenly transmitted for all angles. The light exiting from the prism system will have maintained the original angular distribution.

A further embodiment of the illumination unit according to the invention is characterized in that an air gap is present between the first and the second prism, while at least one spacer element is present between the two hypotenuses.

Due to the presence of the air gap between the two prisms, the reflective power of the coupling-out surface is determined by the design of the hypotenuses of the two prisms. Total internal reflection at the location of the holes is maintained in this case. The spacer elements ensure that the space between the two prisms remains constant, while they may also ensure shielding of the detector so that unwanted light is inhibited from reaching the detector.

A further embodiment of the illumination unit according to the invention is characterized in that at least the side surface of the second prism has an antireflective coating.

To optimize the separation between light from the light source and light caused by back-reflections, the side surface of the second prism is preferably provided with an antireflective coating to inhibit light caused by back-reflections on this surface from being reflected to the detector. In addition to the side surface, the surface perpendicular thereto may also be provided with an antireflective coating.

A further embodiment of the illumination unit according to the invention is characterized in that a beam dump is provided on the side surface of the second prism.

A beam dump receives the light leaving the side surface and being unwanted for the detector and thus prevents further unwanted reflections or diffusion.

A further embodiment of the illumination unit according to the invention is characterized in that a diffuser is present between the exit surface of the prism system and the detection system.

Each point of the diffuser which is excited behaves as a point source, so that the emission of the diffuser is independent of the angle of incidence. As a result, the light coming from the exit surface is homogenized before it is incident on the detector.

The diffuser may be secured to the prism surface but may also be detached from this surface. In the latter case, it is relatively simple to replace the diffuser in case of degradation of this diffuser.

The diffuser may be formed from, for example, milk glass. This consists of at least two glass phases having different refractive indices.

A further embodiment of the illumination unit according to the invention is characterized in that the diffuser is formed from opalescent glass.

Opalescent glass consists of a relatively thin layer of milk glass on an optically transparent support. This has the advantage that a greater transmission can be achieved because it is sufficient to use a much thinner layer of milk glass as compared with the use of milk glass only. If only milk glass is used, this glass must have a minimum thickness in order that the risk of damage is not too great.

A further embodiment of the illumination unit according to the invention is characterized in that the spacer element is a flexible diaphragm and in that the diffuser is step-shaped, the part having the largest diameter facing the detection system.

If the spacer element is constituted by a shielding diaphragm and the diffuser is step-shaped, in which the part having the smallest cross-section faces the top prism, the diaphragm and the step jointly constitute a labyrinth. This labyrinth prevents unwanted light from reaching the detector. The flexible diaphragm preferably extends beyond the sides of the top prism in order to optimize the shielding from unwanted light.

A further embodiment of the illumination unit according to the invention is characterized in that a diaphragm is situated between the diffuser and the prism system.

This layer shields the entrance window of the detection system from unwanted light. The diaphragm may be constituted, for example, by a layer comprising chromium, provided with a hole which is smaller than the exit surface of the prism system.

A further embodiment of the illumination unit according to the invention is characterized in that the energy sensor comprises a sensor tube operating as an optical integrator.

The homogeneity and intensity of the beam incident on the detector are thereby enhanced. The sensor tube may be, for example, a tube having inner walls with a highly reflective coating. It may alternatively be an optically transparent bar or an Ulbricht sphere.

Due to internal reflections, the measuring radiation entering the detection system, possibly coming from different positions and entering at different angles is mixed and directed in such a way that it is completely incident on the detector.

Under circumstances, use may be made of total internal reflection on the inner wall of the sensor tube for the reflections.

The invention also relates to an apparatus for repetitively imaging a mask pattern on a substrate, which apparatus comprises an illumination unit as described hereinbefore.

The apparatus according to the invention is characterized in that the apparatus is provided with a feedback unit for controlling the radiation source on the basis of measurements of the energy sensor.

The reason why it is important to know the illumination energy is different for steppers and scanners. In a stepper, the measured illumination energy determines the opening time of the shutter, hence the required illumination period. In a scanner, it is important that the illumination dose is uniform within one and the same field. The full field is not illuminated simultaneously in this case. The measurement of the illumination energy may subsequently be used to control the radiation source unit in such a way that the illumination dose is uniform within one and the same field.

These and other aspects of the invention will be apparent from and elucidated with reference to the embodiments described hereinafter.

BRIEF DESCRIPTION OF THE DRAWINGS

For a fuller understanding of the invention, reference is had to the following description taken in connection with the following drawings, in which.

DETAILED DESCRIPTION OF THE PREFERRED EMBODIMENTS

Figure 1:
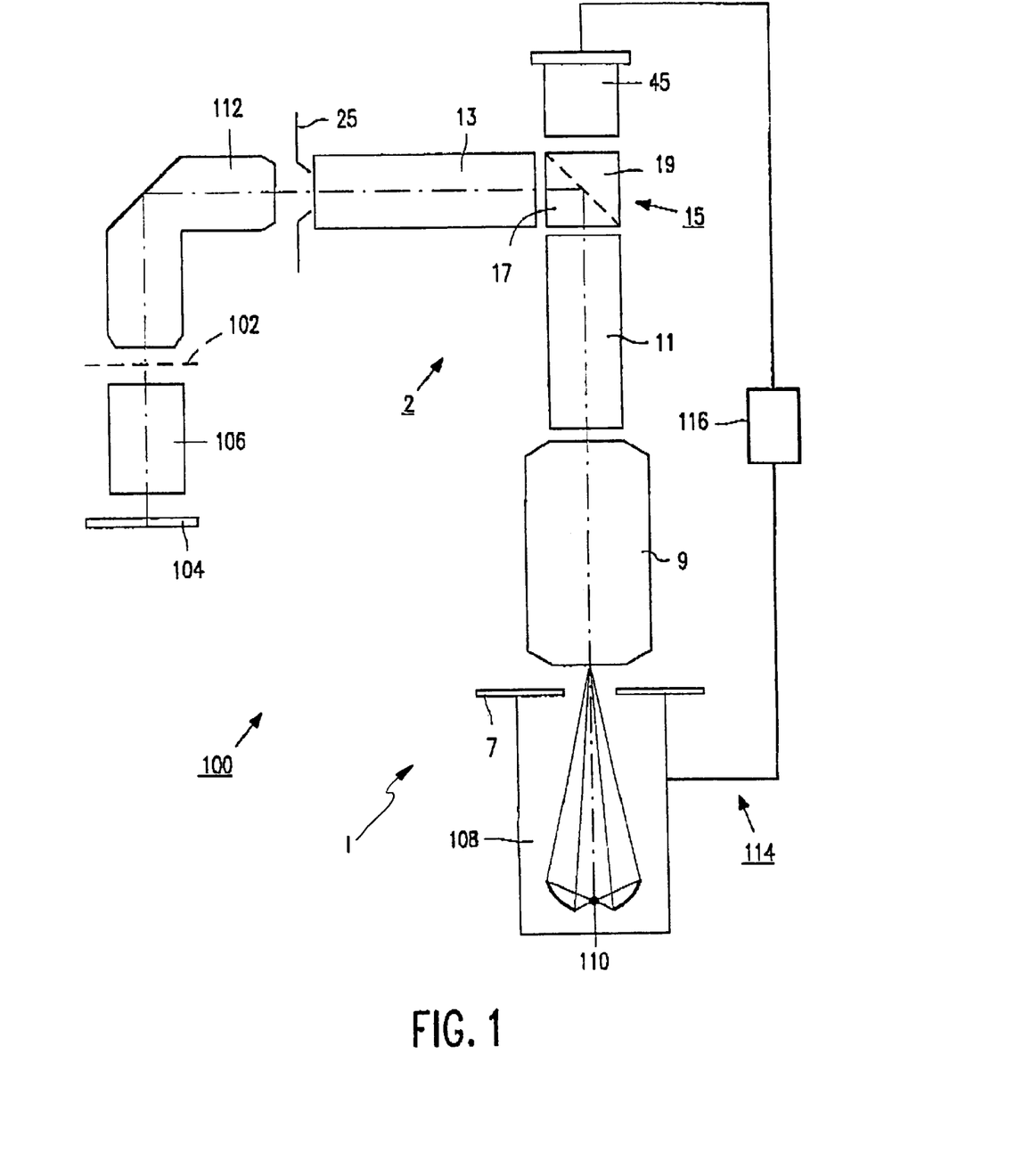
FIG. 1 shows diagrammatically an embodiment of an apparatus for repetitively imaging a mask pattern on a substrate according to the invention.

FIG. 1 shows diagrammatically an apparatus 100 for repetitively imaging a mask pattern 102 on a substrate 104, for example, a photolithographic apparatus. The substrate may be, for example, silicon on which is provided a photosensitive layer. The apparatus 100 comprises an illumination system 1 for supplying an illumination beam. The illumination system 1 comprises a radiation source unit 108 with a radiation source 110. The radiation source may be, for example, a mercury lamp in combination with an elliptic mirror, as is shown in FIG. 1. The radiation source may also be, for example, an excimer laser. The light beam supplied by the radiation source unit 108 is transmitted to a lens system 9 via the aperture of a shutter 7. Arranged behind the lens system 9 is an optical radiation-guiding system having the role of, inter alia, an integrator, which will be further described hereinafter. For example, an internal REMA 25 may be present at the end of this system. The internal REMA ensures that the illuminated area of the mask is sharply bounded. The lens system 112 images the REMA on the mask 102 which in its turn is imaged on the substrate 104 by the projection lens system 106. Both the mask 102 and the substrate 104 are each present on a table (not shown). In such an optical apparatus it is important that the illumination dose with which the radiation-sensitive layer on the substrate is illuminated can be measured and controlled. To this end, the apparatus 100 comprises, in addition to an illumination system 1, a detection system 45 jointly constituting an illumination unit 2. In principle, such a system may be present at different positions in the apparatus. To be able to perform a maximally reliable measurement, the present invention proposes an illumination unit having a radiation-guiding system whose construction allows light to be coupled out so as to measure the illumination dose with which the substrate 104 will be illuminated, without essentially influencing the intensity in the main light path.

Figure 2:
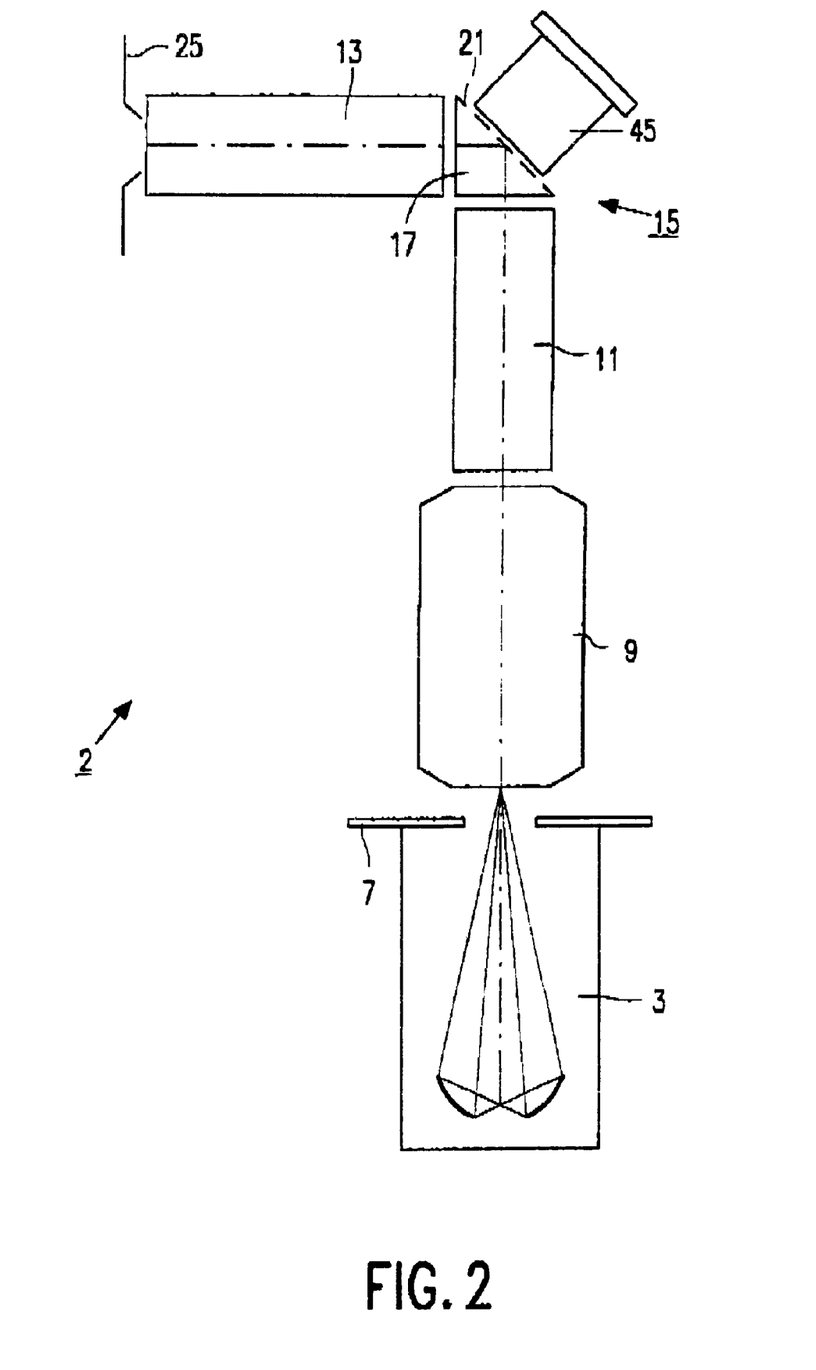
FIGS. 2, 3 and 4 show embodiments of an illumination unit according to the invention.

The illumination unit according to the invention will now be described in detail. FIG. 2 shows a first embodiment of an illumination unit 2 according to the invention. The illumination unit 2 comprises an illumination system 1 and a detection system 45. The illumination system 1 comprises a radiation source unit 3 preceding a shutter 7, a lens system 9, and a radiation-guiding system constituted by the elements 11, 13, 15. An internal REMA is arranged behind the radiation-guiding system. The radiation-guiding system is constituted by a first integrator, for example, an optically transparent bar 11, a prism system 15 and a second integrator, for example, an optically transparent bar 13. The bars may consist of, for example glass or quartz. An optical integrator may alternatively be constituted by a tunnel having reflecting inner walls or by facet eye bar lenses as described, for example, in the United States Patent mentioned above. It is known per se that such a bar operates as an integrator and thus ensures a homogeneous light distribution. The two bars 11, 13 are, for example, mutually perpendicular to each other. The bars may alternatively enclose a different angle, or they may be aligned (see FIG. 9).

The function of the prism system 15 is to guide the main light beam from the first integrator to the second integrator 13 and to couple a small fraction of the light beam out of the main light path, from which the illumination dose can be determined without essentially influencing the intensity in the main light path. To this end, the prism system comprises at least one prism. Moreover, the prism system has a coupling-out surface for coupling a small fraction of the light beam out of the illumination system and an exit surface for coupling this fraction out of the prism system so as to be measured. The embodiment of the prism system determines which faces on the prism system fulfil these functions. In FIG. 2, the prism system 15 comprises only one prism 17. The hypotenuse 21 of the prism 17 may be designed in such a way that the transmission factor thereof is at most a few %, so that only a small fraction of the light beam will be coupled out of the illumination system. The coupling-out surface and the exit surface coincide in this case. In FIG. 2, the prism 17 also ensures the deflection of the light beam. The greater part of a light beam incident on the hypotenuse 21 will be sent towards the second integrator 13, while a small fraction will be transmitted towards the detection system by the side 21. There are different possibilities of giving the hypotenuse 21 an integral transmission factor of at most a few %. These possibilities will hereinafter be described in greater detail.

Figure 3:
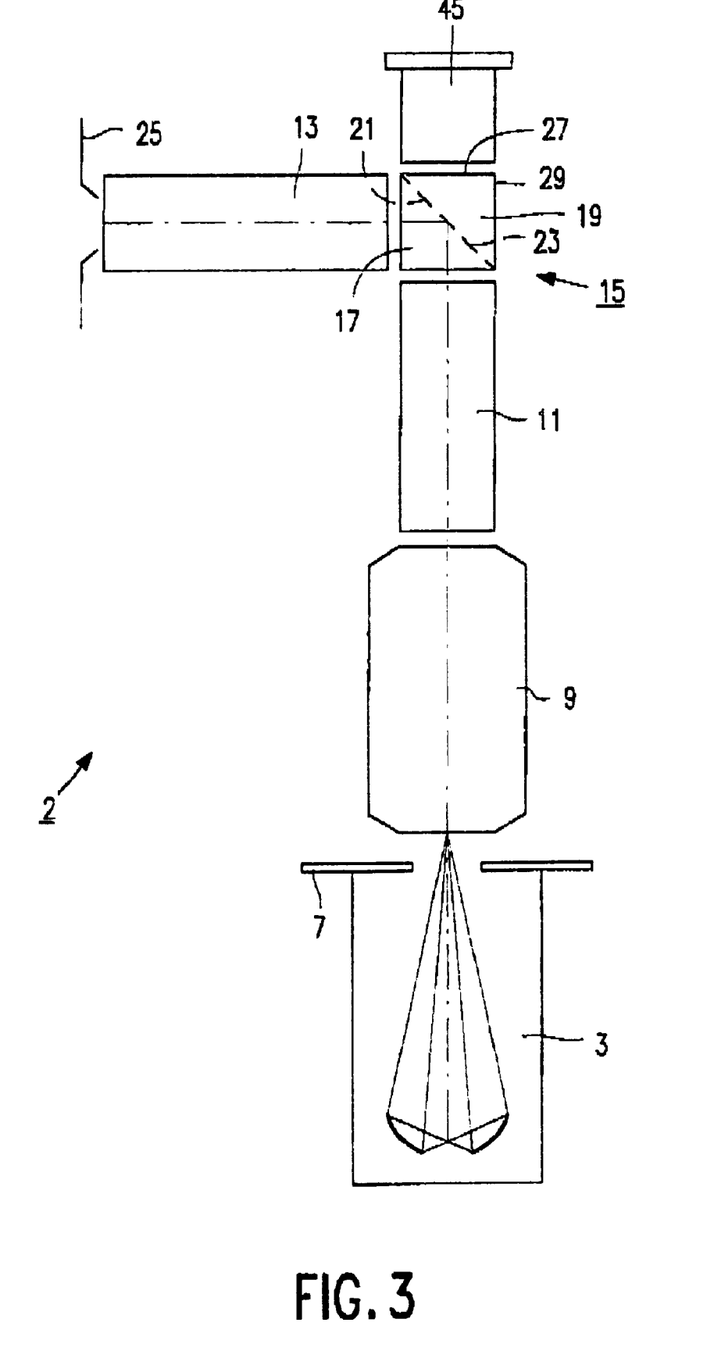

FIG. 3 shows a preferred embodiment of an illumination unit according to the invention. The prism system 15 preferably comprises a first prism 17 with a hypotenuse 21, and a second prism 19, referred to as top prism, with a hypotenuse 23, such that the hypotenuses 21, 23 of the two prisms 17 and 19 face each other. The combination of the two hypotenuses 21, 23 may now be considered to be a coupling-out surface. A fraction of the light beam from the radiation source 3, which beam is incident on the coupling-out surface, will be transmitted towards the top prism 19, while the greater part will be reach the second integrator 13. Here, the first prism 17 also functions as a deflection element. The fraction transmitted by the coupling-out surface will leave the prism 19 via the top surface 27 after possible internal reflection on the side surface 29. In this case, the exit surface of the prism system 15 is constituted by the top surface 27 of the top prism 19. Light reaching the second prism 19 after back-reflections will leave the second prism 19 via the side surface 29. In this manner, the second prism 19 thus ensures that the light from the radiation source 3 and the light caused by back-reflections are separated from each other.

Back-reflections are understood to mean reflections from the substrate, the mask, the internal REMA, if present, and other optical components between the prism system and the substrate.

Moreover, the second prism 19 concentrates the light on the top surface 27, and the light exiting at this surface 27 will have the original angular distribution.

Figure 4:
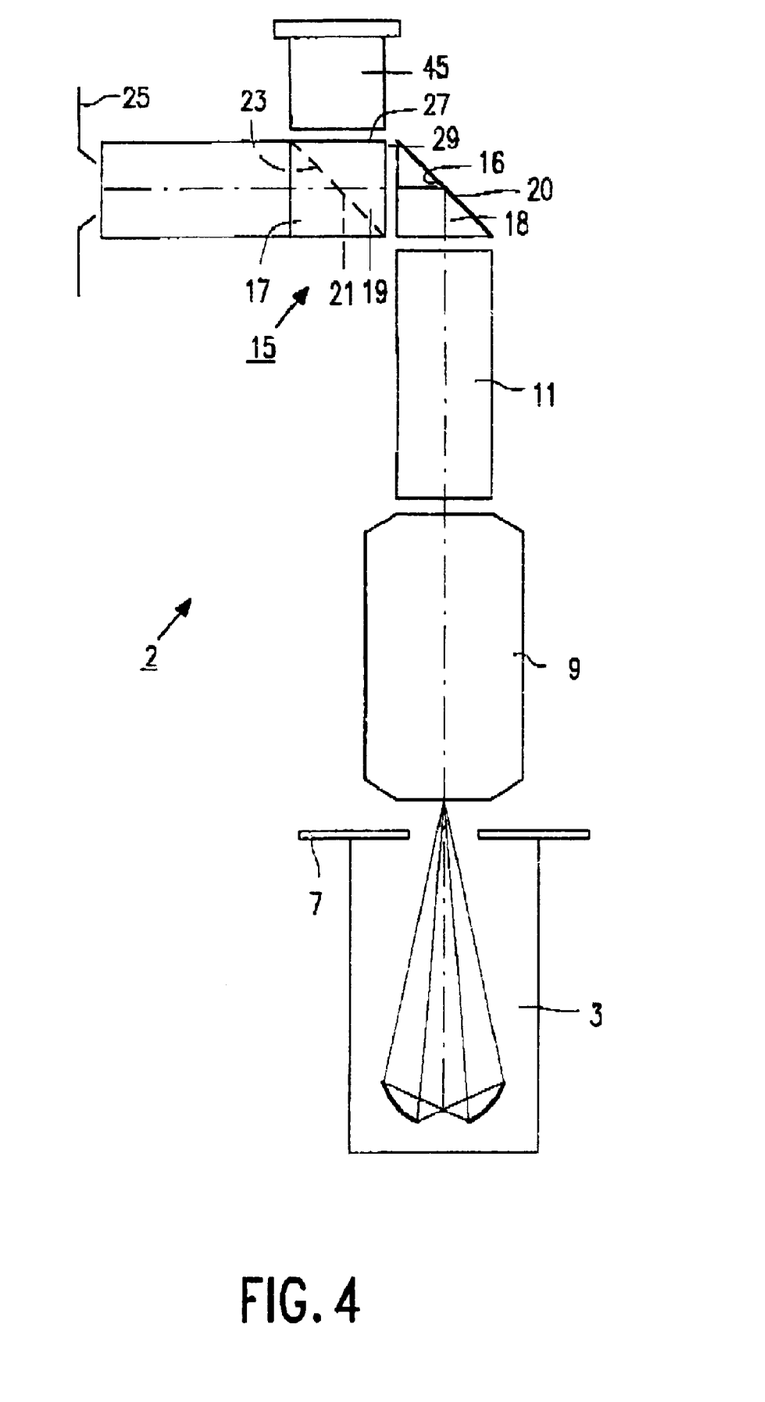

FIG. 4 shows another embodiment of an illumination unit according to the invention. In this embodiment, the prism system 15 comprises three prisms 17, 18, 19. The hypotenuse 21 of the first prism 17 and the hypotenuse 23 of the second prism 19 jointly constitute the coupling-out surface of the illumination system 1. The deflection of the light beam from the first integrator 11 to the second integrator 13 is now ensured by the third prism 18. To this end, the hypotenuse 16 of the third prism 18 is provided with a highly reflective layer 20. The coupling-out surface 21, 23 should now have a high transmission for the light beam in the direction of the integrator 13, and only a small fraction may be reflected towards the detection system 45. The exit surface is constituted by the top surface 27 of the second prism 19. An advantage of this embodiment is that the deflection function and the coupling-out function are separated from each other, so that it is possible to optimize the required layers for their own function. Moreover, it is not required to have an air gap between the first prism 17 and the bar 13. This provides the possibility of integrating the first prism 17 with the integrator 13. In this case, it is sufficient to give the bar 13 an oblique side at an angle of, for example, 45° which will then be situated opposite the hypotenuse 23 of the second prism 19.

In the illumination unit as described above it is possible to couple an amount of light out of the illumination system, with reference to which the illumination dose incident on the substrate can be measured in a reliable way without essentially influencing the intensity in the main light path.

In each of these embodiments, the coupling-out surface may be implemented in different manners. The different possibilities will be described hereinafter. These possibilities will be illustrated with reference to FIGS. 5(a) to 5(i).

Figure 5A:
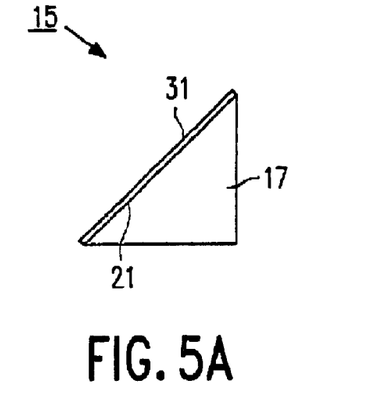
FIGS. 5(a) to 5(i) show some embodiments of a prism system for use in an illumination unit according to the invention.
Figure 5B:
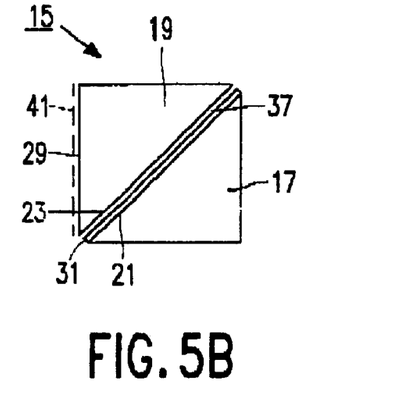

One possibility is to provide the hypotenuse 21 of the first prism 17 with a reflective layer 31 having the desired transmission factor as is shown in FIGS. 5(a) and 5(b) for a prism system with a single prism, a first prism and a second prism, respectively. The reflective layer 31 is preferably a highly reflective and is independent of the angle within the range between 20° and 70° of angles of incidence, viewed with respect to the normal on the hypotenuse 21. The system may be maintained telecentric due to the independence of angles.

Figure 5C:
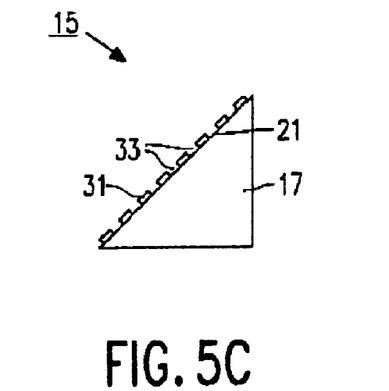
Figure 5D:
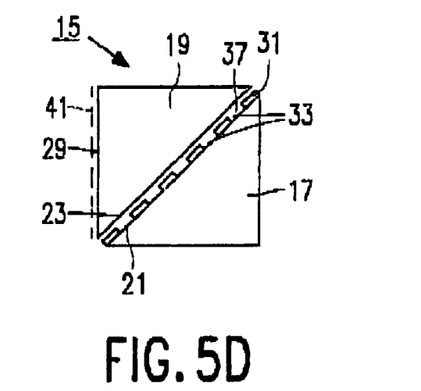

A sufficient reflection may be obtained by means of, for example a reflective layer comprising aluminium. An advantage of aluminium is a relatively large independence of the angle. The desired transmission factor may be achieved, for example by means of a suitable thickness of the layer. Another way of achieving the desired transmission factor is to provide the layer with holes. To obtain, for example, a transmission factor of between 0.5% and 1.5%, typical dimensions for the holes are 150 $\mu$m and the distance between these holes is preferably between 0.6 and 0.9 mm. The value of the transmission factor is also determined by the fact whether the hypotenuse forms an interface with air or is glued. If the reflective layer is provided with holes, the thickness of the layer is of less importance. It is advantageous to render the layer as optically dense as possible and to realize the transmission mainly through the apertures. In this case, the environmental factors have a minimal influence. In fact, the locations where the light is transmitted, i.e. at the location of the holes, are untreated and, in contrast to locations where the layer extends, will not be liable to temperature fluctuations and the like. Embodiments in which the reflective layer 31 is interrupted by holes 33 are shown in FIGS. 5(c) and 5(d). These possibilities apply to both a prism system with one prism and to a prism system with two or three prisms. In the embodiment with three prisms, the fraction coupled out to the detection system is produced by reflection on the coupling-out surface, rather than by transmission, as is the case in the other aforementioned embodiments.

Another possibility of realizing a reflective layer is to provide the layer 31 with a dielectric material. A dielectric layer has a relatively high reflection. Moreover, to be able to realize a relatively large independence of angle with a dielectric layer, a layer consisting of different sub-layers of different dielectric materials with different refractive indices is required.

Such a layer may also be provided with holes so as to realize the desired transmission factor.

It is alternatively possible to implement the reflective layer 31 as a combination of aluminium with a dielectric material. In this way, the advantage of a large independence of angle of aluminium is combined with the advantage of a relatively high reflection of the dielectric material.

If the hypotenuse 21 of the first prism 17 is provided with a reflective layer 31 with holes 33, a part of a light beam incident thereon with the angles of incidence at which the reflection of the layer is independent of the angle will be sent towards the second integrator 13 and will consequently be unable to reach the second prism 19. A part of the light incident on the holes 33 in the layer 31 will undergo total internal reflection, and another part will be transmitted via the hypotenuse 21.

Figure 5E:
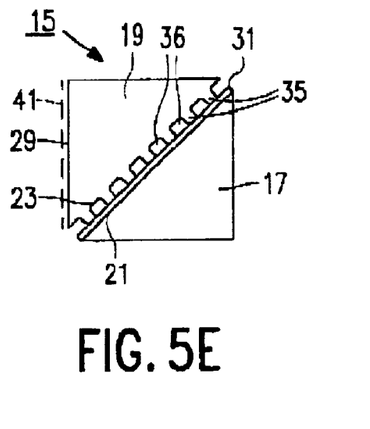
Figure 5F:
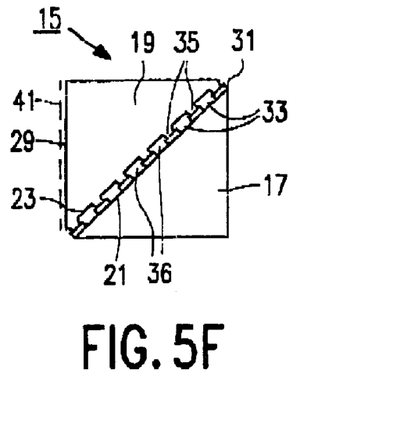

FIGS. 5(e) and 5(f) show other embodiments of a prism system in which the reflective layer comprises a dielectric material. In the prism system 15 with a deflection prism 17 and a top prism 19, the hypotenuse 23 of the top prism 19 is provided with projections 35 which are present at a well-defined distance from each other and are in optical contact with the hypotenuse 21 of the first prism 17 and are made of a material having the same refractive index as the top prism 19. Such projections 35 may be realized, for example, by etching material from the surface of the hypotenuse 23. Since the angular range of the reflective layer 31 is limited to relatively small angles with respect to the normal on the hypotenuse 21, and since the total internal reflection is eliminated at the location of the projections 35, the light rays incident at a relatively large angle with respect to the normal on the hypotenuse 21 will be transmitted at the location of the projections 35. The intermediate areas 36 may be provided with a layer having an optical density which is larger than that of the projections, so as to obstruct the residual transmission through the reflective layer 31.

By providing holes 33 in the reflective layer 31 on the hypotenuse 21 of the first prism 17, as well as projections 35 on the hypotenuse 23 of the second prism 19, a symmetrical angular transmission is obtained. In fact, light rays which are incident on the coupling-out surface at a small angle are transmitted through the holes, and light rays which are incident at a larger angle of incidence are transmitted through the projections. The transmission through the projections and the holes is complementary. In this case, the measurement by the detection system will be substantially independent of the angular distribution within the light beam.

The first prism 17 and the second prism 19 may be in a separate position with respect to each other but they may also be glued together. This possibility is advantageous if the reflective layer is formed from aluminium, provided or not provided with holes. Then, the holes will transmit all incident light. The transmission through the holes will be independent of the angle of incidence because the total internal reflection is eliminated at the location of the holes.

Figure 5G:
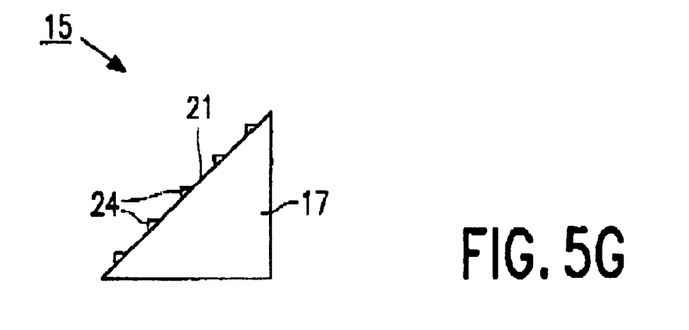
Figure 5H:
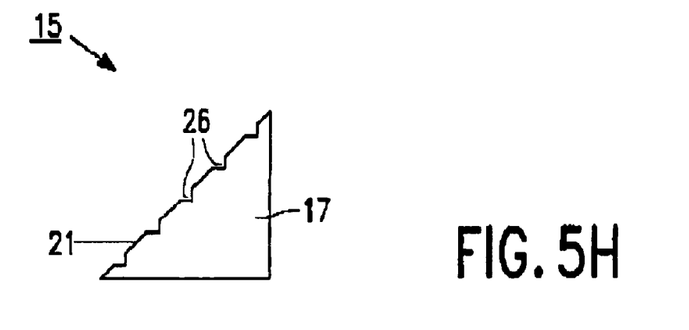
Figure 5I:
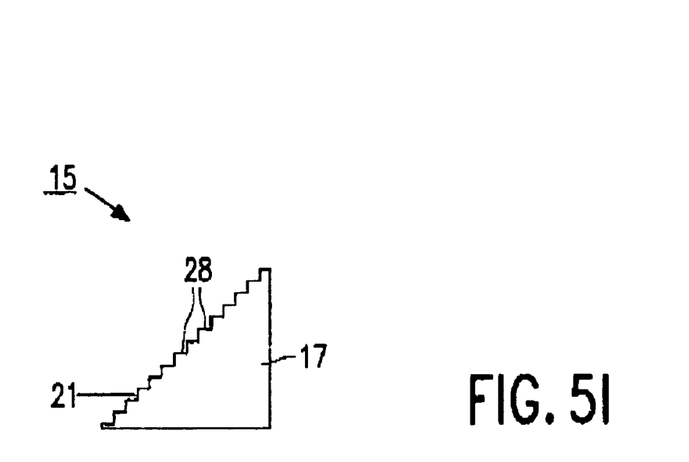

Yet another possibility of realizing a coupling-out surface having a given transmission factor is to provide one of the hypotenuses 21, 23 with a surface structure which is partly transmissive and partly reflective. This may be achieved by means of recesses 26, microprisms 24 or a microdiffuser 28. Embodiments thereof are shown in FIGS. 5(g) to 5(i). These embodiments of the prism system 15 are only possible if the prism system 15 comprises one prism 17 only.

Figure 6:
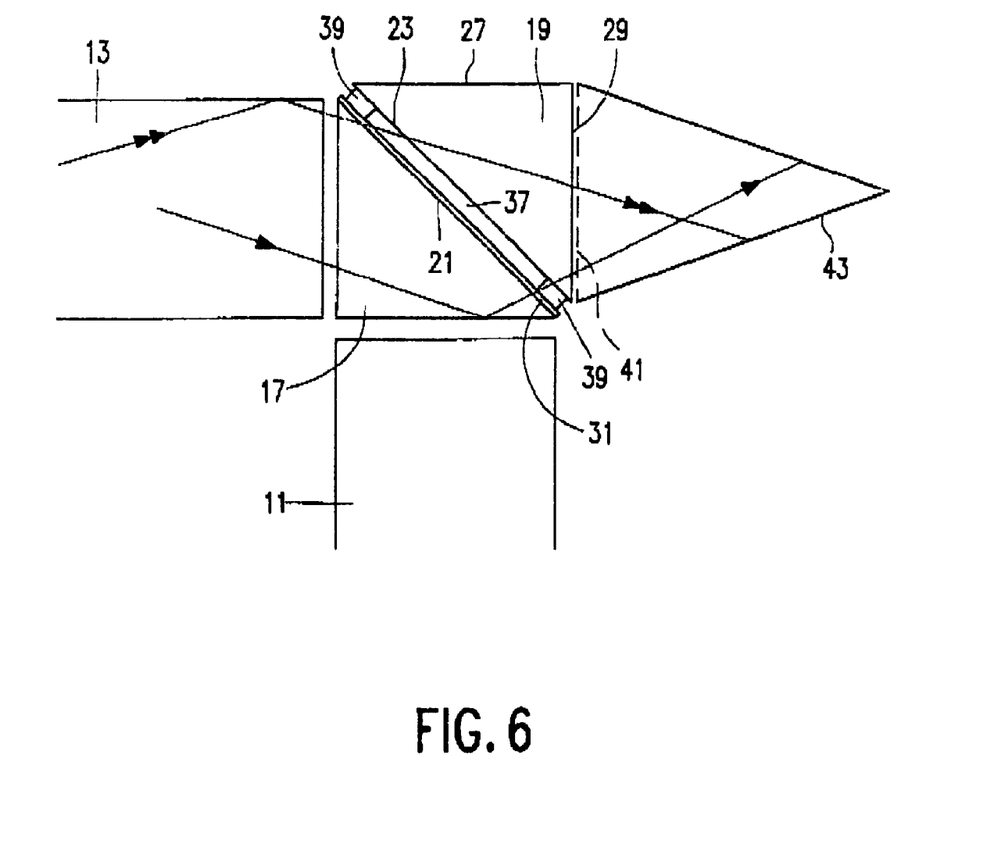
FIG. 6 shows an embodiment of a prism system with two prisms for use in an illumination unit according to the invention, which prism system is provided with spacer elements and a beam dump.

The two prisms 17, 19 may alternatively be present at a well-defined distance from each other, with an air gap 37 being present between the two prisms 17, 19. The size of the air gap 37 may be maintained constant by providing at least one spacer element 39 between the two prisms, as is illustrated in FIG. 6 with reference to a prism system as shown in FIG. 5(b). Such a spacer element 39 may be formed, for example, by a shielding diaphragm. This diaphragm may also shield the hypotenuse 23 of the second prism 19 from unwanted light and thus prevent this light from reaching the detection system 45. The diaphragm preferably extends beyond the prism system so that the shielding against unwanted light is optimized.

In the embodiments using a second prism, the second prism 19 separates the light from the radiation source 3 from light caused by back-reflections. The light from the radiation source 3 leaves the prism system 15 along the top surface 27 of the second prism 19, whereas the light caused by back-reflections leaves the prism system 15 along the side surface 29 of the second prism 19. The side surface 29 of the second prism 19 is preferably provided with an antireflective coating 41 so that substantially all the incident light is transmitted. Moreover, a beam dump 43 as is shown in FIG. 6 may be arranged behind this surface 29, so that the unwanted light is received and possibly absorbed so that it is prevented from undergoing further unwanted reflections or diffusion. A beam dump is an element which is known per se. FIG. 6 also illustrates the radiation path of back-reflections.

If the prism system 15 comprises one prism 17 only, the detection system 45 is situated opposite the hypotenuse 21 of the first prism 17. If the prism system 15 comprises two prisms 17, 19 or three prisms 17, 18, 19, the detection system 45 is arranged opposite the top surface 27 of the second prism 19. If two prisms are used, the measurement will substantially not be influenced by back-reflections in the system. Moreover, a homogeneous light beam is obtained at the area of the measurement. This is very important because the active surface of the detector of the detection system 45 is relatively small.

Figure 7:
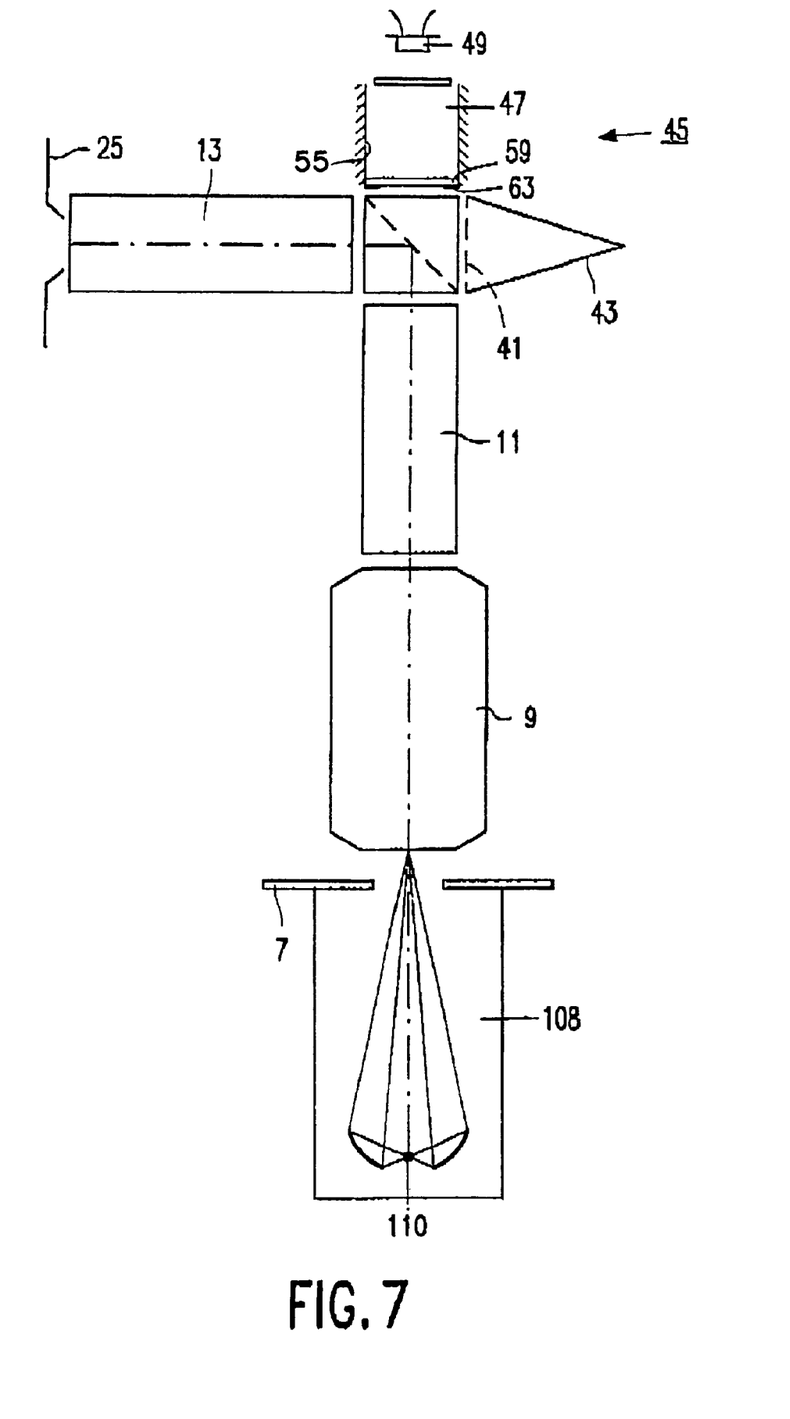
FIG. 7 shows an embodiment of an illumination unit according to the invention.

The detection system 45 comprises a sensor tube 47, at the end of which a detector, for example, a photodiode 49 is present (FIG. 7). Moreover, the detection system 45 may be provided, for example, with several color filters (not shown) to ensure that only the desired wavelength is incident on the detector, and with a grey filter for controlling the intensity of the light incident on the detector so as to prevent damage of this detector.

To optimize the integration of the measuring beam, the detection system comprises light-integrating means. To this end, the inner walls 55 of the sensor tube 47 are highly reflective. This has the advantage that a higher intensity of the photodiode 49 and a better integration can be realized, because such a tube also functions as an integrator. The less intensity is to be coupled out of the main light path, the less the intensity in the main light path will be influenced for measuring the illumination dose.

The sensor tube may be constituted by an optically transparent bar or by a tunnel having reflecting walls. A high degree of integration can also be achieved with an Ulbricht sphere.

A diffuser 59 of the Lambertian type may be arranged between the hypotenuse 21 and the detection system 45, if a prism system 15 with only one deflection prism is used, or between the top surface 27 and the detection system 45, if a prism system 15 with two prisms 17, 19 or three prisms 17, 18, 19 is used. Each point of such a diffuser behaves as a point source so that the emission of the diffuser is independent of the angle of incidence of the light incident thereon. The diffuser ensures a homogeneous light distribution of the light beam which is incident on the detector of the detection system.

The signal strength may be varied by changing the distance between the diffuser 59 and the photodiode 49 of the detection system 45. However, this distance should not be too large because the signal decreases too rapidly with an increasing distance.

The diffuser may be formed from, for example milk glass. This glass consists of at least two glass phases having different refractive indices. The diffuser may alternatively be implemented as an opalescent glass. An opalescent glass consists of an optically transparent supporting plate, for example, glass, provided with a relatively thin layer of milk glass. The advantage of this second possibility is that it is sufficient to use a thinner layer of milk glass so that a higher transmission can be achieved than in the first-mentioned implementation of the diffuser.

The diffuser may be glued to the exit surface of the prism system but may also be separate from this surface. The first possibility has the advantage that there is one surface less on which unwanted reflections may occur. The second possibility has the advantage that the diffuser may be easily replaced without the risk of damage of the prism system 15.

A chromium window 63 is preferably arranged on the diffuser 59, with the dimension of the aperture of this window being smaller than that of the exit surface of the prism system, so as to ensure that unwanted light is prevented from reaching the detection system.

In principle, light which is incident on the detection system should come from all field positions and have a homogeneous distribution. The total integrating effect is obtained by the first integrator, the diffusion by the diffuser, the distance between the diffuser and the photodiode, and the mixing in the sensor tube.

Figure 8:
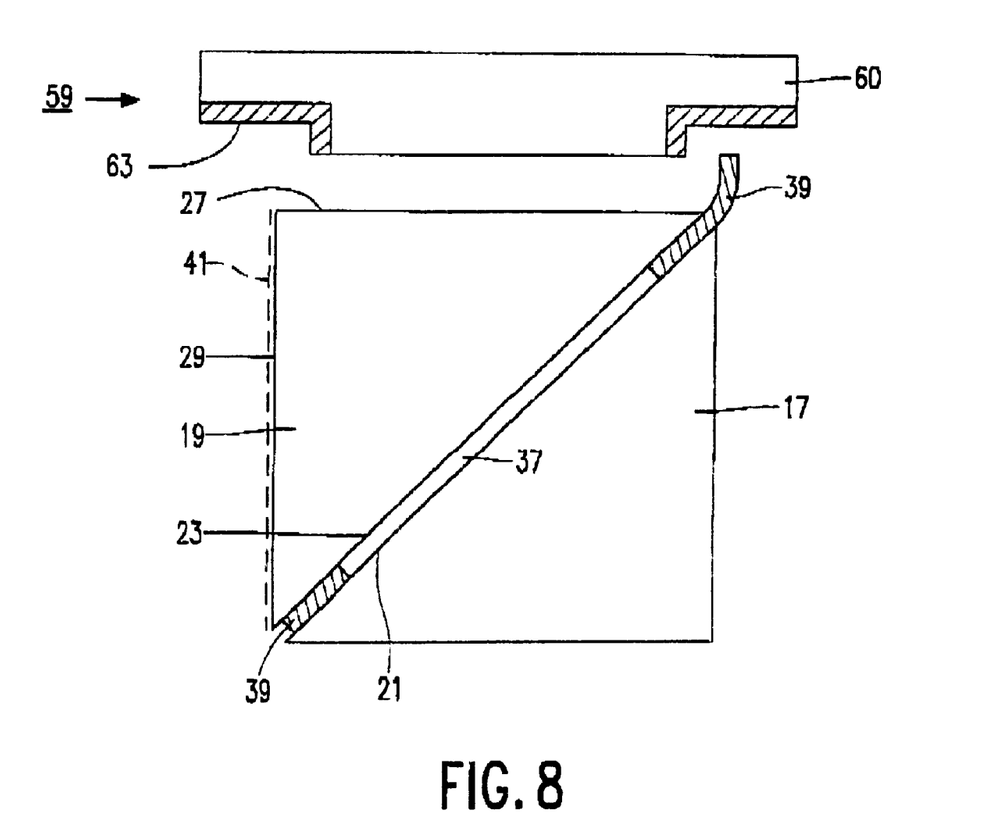
FIG. 8 shows an embodiment of a prism system with a diffuser for use in an illumination unit according to the invention.

A preferred embodiment of the prism system 15 is illustrated in FIG. 8. Here, the spacer element 39 is constituted by a shielding diaphragm of flexible material which extends beyond the surface of the hypotenuses 21, 23 in a plane perpendicular to the drawing, in combination with a step-shaped diffuser 59 whose part 60 having the largest diameter faces the detection system. By folding the diaphragm 39 towards the diffuser 59, a labyrinth is formed between the step of the diffuser 59 and the diaphragm 39. As a result, unwanted light is prevented from reaching the detection system 45.

When the desired transmission factor is realized by a reflective layer 31 with holes 33, the surface of the hypotenuse over which the holes are distributed is preferably smaller than the total surface of the hypotenuse, so as to prevent light, which is transmitted through the holes, from reaching the diaphragm and the detection system after unwanted diffusion or reflection.

The detection system not only has the function of measuring the illumination dose and controlling, with reference thereto, the amount of light supplied by the illumination system, but also of reducing the influence of lamp fluctuations in uniformity measurements. Moreover, the detection system may be used for positioning the lamp.

Coupling light for the detection system out of the prism system at the position as proposed in the present invention has the advantage that the energy can be measured independently of the angular distribution within the light beam and the adjustment of the internal REMA, if present, without essentially influencing the intensity in the main light path.

The illumination unit according to the invention thus provides the possibility of coupling an amount of light out of the optical path, with reference to which the illumination dose incident on the substrate can be measured in a reliable and reproducible manner.

Moreover, the apparatus 100 is provided with a feedback circuit 114 arranged between the detection system 45 and the radiation source unit 108. The circuit includes a feedback unit 116 which controls the radiation source 108 on the basis of the illumination dose measured by the detection system 45.

The control of the radiation source unit on the basis of the measured illumination dose may be effected in different manners. A first manner is to control the intensity of the light supplied by the radiation source by means of feedback circuit 114 by controlling, via a control unit 116, for example, the current with which the lamp is driven. Another manner is to arrange an attenuator (not shown) having a variable transmission in the illumination unit in front of the detection system, as viewed from the radiation source, the transmission of the attenuator being determined and feedback-controlled by the measurement of the detection system.

Figure 9:
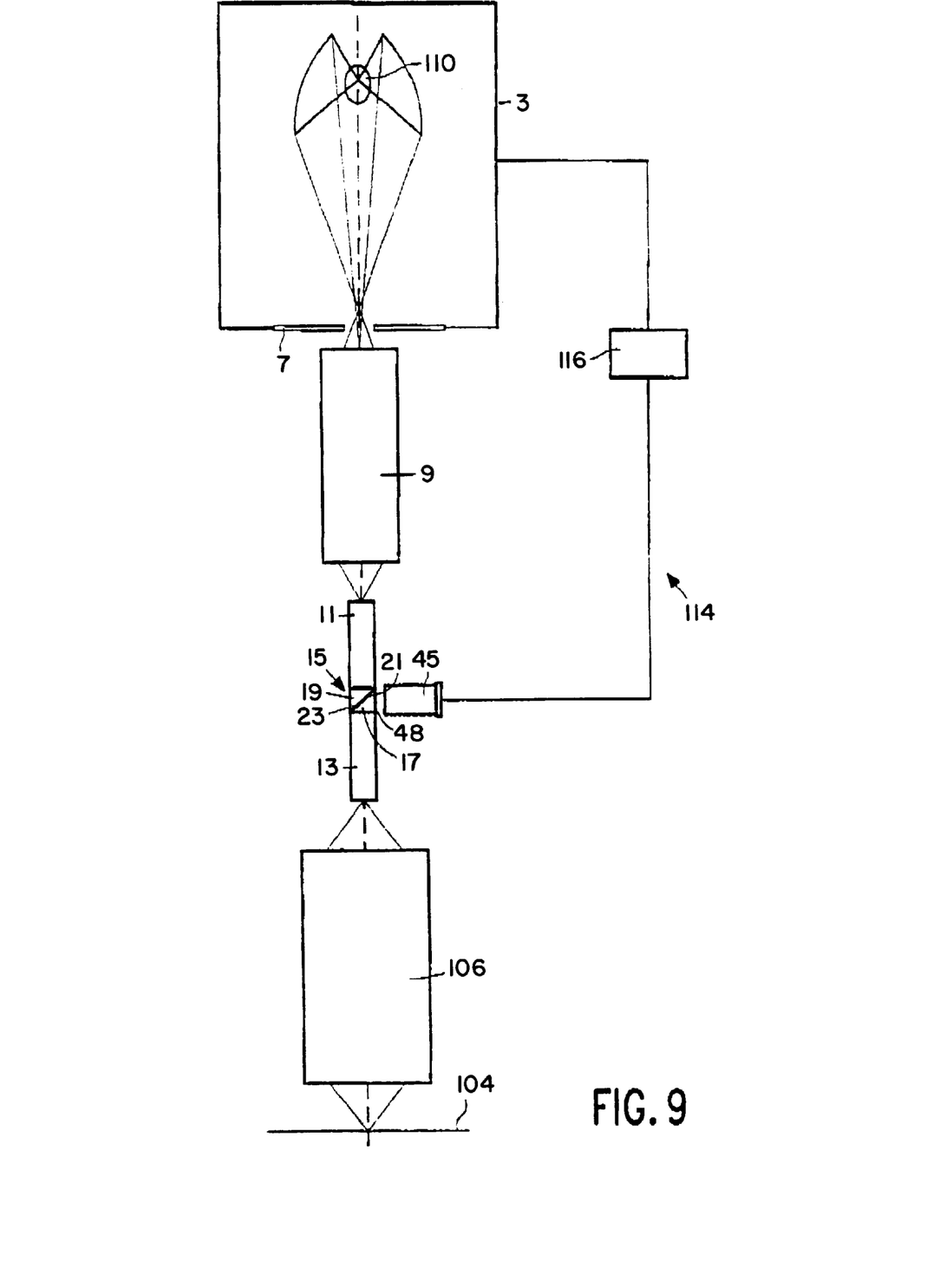
FIG. 9 shows an embodiment of an illumination unit according to the invention.

FIG. 9 illustrates another embodiment of an apparatus according to the invention.

In this case, the radiation-guiding system is constituted by a first optically transparent bar 11 and a second optically transparent bar 13, both enclosing a prism system 15. The prism system 15 may comprise, for example, two prisms 17, 19 having such hypotenuses 21, 23 that the coupling-out surface constituted jointly by these hypotenuses is partly reflective and partly transmissive. This coupling-out surface couples light out of the main light path. In the example shown in the Figure, the reflection coefficient of the coupling-out surface is preferably only several %, so that the intensity in the main light path is not influenced, or hardly influenced by the energy measurement.

Here, the detection system 45 may be arranged opposite the surface 48 of the first prism 17.

In a photolithographic apparatus which is provided with an illumination unit according to the invention, the homogeneity of the illumination beam for the substrate and the homogeneity of the measuring beam for the detector are optimized. Moreover, the quantity of unwanted light incident on the detector is reduced considerably. In this way, it is possible to measure the illumination dose in an accurate and reproducible manner, in other words, independently of the angular distribution within the illumination beam and of back-reflections, and to subsequently adjust the dose in accordance with the circumstances of using the apparatus.

What is claimed is:

1. An illumination unit for an optical system, including an illumination system which comprises, in this order, a radiation source unit, a first optical integrator, and a detection system having an entrance aperture and including a radiation-sensitive detector constructed and arranged to measure an illumination dose, wherein the illumination system comprises a second optical integrator and the two integrators enclose a prism system comprising at least one prism, which prism system has a coupling-out surface via which a fraction of light can be coupled out of the illumination system, and an exit surface via which said fraction of light can be coupled out of the prism system, the entrance aperture of the detection system being situated proximate to the exit surface of the prism system.

2. An illumination unit as claimed in claim 1, wherein the detection system comprises a light integrator.

3. An illumination unit as claimed in claim 1 wherein the prism system comprises one prism whose hypotenuse is the coupling-out surface of the illumination system and the exit surface of the prism system.

4. An illumination unit as claimed in claim 1, wherein the prism system comprises a first and a second prism whose hypotenuses face each other, while the coupling-out surface is located between the two prisms and the exit surface coincides with a top surface of the second prism.

5. An illumination unit as claimed in claim 1, wherein the prism system comprises a first and a second prism whose hypotenuses face each other; while the coupling-out surface is located between the two prisms and the exit surface coincides with a side surface of the first or the second prism.

6. An illumination unit as claimed in claim 1, wherein the prism system comprises a first and a second prism having hypotenuses facing each other, and a third prism is located between the first and the second prism, at one end, and the first integrator, at the other end, a hypotenuse of said third prism being provided with a highly reflective coating, while the coupling-out surface is present between the first and the second prism and the exit surface coincides with a top surface of the second prism.

7. An illumination unit as claimed in claim 1, wherein a hypotenuse of said at least one prism is provided with a reflective layer which is at least partly transmissive.

8. An illumination unit as claimed in claim 5, wherein the hypotenuse of the first prism is provided with a transmissive layer which is at least partly reflective.

9. An illumination unit as claimed in claim 7, wherein the reflective layer has a plurality of holes.

10. An illumination unit as claimed in claim 7, wherein the reflective layer comprises aluminum.

11. An illumination unit as claimed in claim 7, wherein the reflective layer comprises a dielectric material.

12. An illumination unit as claimed in claim 11, wherein projections are present on the hypotenuse of one of the two prisms, which projections are in optical contact with the hypotenuse of the other prism.

13. An illumination as claimed in claim 12, wherein material having a larger optical density than that of the projections is present between the projections.

14. An illumination unit as claimed in claim 3, wherein the hypotenuse of said one prism has a surface structure in the form of at least one of prisms, recesses and a microdiffuser.

15. An illumination unit as claimed in claim 4, wherein the hypotenuses of the first and second prism are glued together, a refractive index of the glue and a refractive index of the prisms being substantially equal.

16. An illumination unit as claimed in claim 4, wherein an air gap is present between the first and the second prism, while at least one spacer element is present between the two hypotenuses.

17. An illumination unit as claimed in claim 4, wherein at least a side surface of the second prism is provided with an antireflective coating.

18. An illumination unit as claimed in claim 3, wherein a beam dump is located next to a side surface of said one prism.

19. An illumination unit as claimed in claim 1, wherein a diffuser is present between the exit surface of the prism system and the detection system.

20. An illumination unit as claimed in claim 19, wherein the diffuser is formed from opalescent glass.

21. An illumination unit as claimed in claim 16, characterized in that a diffuser is present between the exit surface of the prism system and the detection system.

22. An illumination unit as claimed in claim 19, wherein a diaphragm is situated between the diffuser and the prism system.

23. An illumination unit as claimed in claim 1, wherein the detection system comprises a sensor tube operating as an optical integrator.

24. An apparatus for repetitively imaging a mask pattern on a substrate, comprising an illumination unit as claimed in claim 1.

25. An apparatus as claimed in claim 24, wherein the apparatus is provided with a feedback unit constructed and arranged to control the radiation source on the basis of measurements of the radiation sensitive detector.

26. An illumination unit as claimed in claim 21, wherein the spacer element is a flexible diaphragm and the diffuser is step-shaped in which a part having the largest diameter is facing the detection system.

27. An optical illumination unit, comprising:

a radiation source unit;

a first optical integrator having a light input region and a light output region and being disposed in an optical path of light from said radiation source unit, wherein light from said radiation source unit enters said input region of said first optical integrator and integrated light exits from said output region of said optical integrator;

a prism system comprising a prism and being disposed in a path of said integrated light output from said first optical integrator, said prism system having a light input region, a light output region and a coupling-out region, wherein a fraction of integrated light that enters said light input region of said prism system exits said prism system through said coupling-out region, while substantially the remaining fraction of said integrated light that enters said light input region of said prism system exits said prism system through said light output region of said prism system;

a second optical integrator having a light input region and a light output region and being disposed in an optical path of said light from said light output region of said prism system; and a detection system having an entrance aperture and a light-sensitive detector, said entrance aperture of said detection system being disposed in an optical path of said light from said coupling-out region of said prism system.

* * * * *